(12) United States Patent
Tan

(10) Patent No.: US 6,761,085 B1
(45) Date of Patent: Jul. 13, 2004

(54) METHOD AND APPARATUS FOR DAMPING VIBRATIONS IN A SEMICONDUCTOR WAFER HANDLING ARM

(75) Inventor: Mark Tan, Santa Clara, CA (US)

(73) Assignee: Novellus Systems Incorporated, San Jose, CA (US)

( * ) Notice: Subject to any disclaimer, the term of this patent is extended or adjusted under 35 U.S.C. 154(b) by 27 days.

(21) Appl. No.: 10/068,594

(22) Filed: Feb. 6, 2002

(51) Int. Cl.[7] .............................................. F16M 13/60
(52) U.S. Cl. ................... 74/490.01; 267/137; 188/380; 414/935
(58) Field of Search ................................ 267/137, 141; 74/490.01; 188/380, 379, 376; 414/935

(56) References Cited

U.S. PATENT DOCUMENTS

| | | | | |
|---|---|---|---|---|
| 2,736,393 A | * | 2/1956 | O'Connor | 188/380 |
| 3,288,419 A | * | 11/1966 | Wallerstein, Jr. | 248/550 |
| 4,322,063 A | * | 3/1982 | Fischbeck et al. | 267/160 |
| 4,852,848 A | * | 8/1989 | Kucera | 248/559 |
| 5,102,289 A | * | 4/1992 | Yokoshima et al. | 414/744.2 |
| 6,134,964 A | * | 10/2000 | Jaenker et al. | 73/514.21 |
| 6,397,988 B1 | * | 6/2002 | Ptak | 188/380 |
| 6,508,343 B2 | * | 1/2003 | Misaji et al. | 188/379 |

FOREIGN PATENT DOCUMENTS

| | | | |
|---|---|---|---|
| JP | 59-110938 | * | 6/1984 |
| JP | 6-91583 | * | 5/1994 |

* cited by examiner

Primary Examiner—David A. Bucci
Assistant Examiner—Colby Hansen
(74) Attorney, Agent, or Firm—DeLio & Peterson, LLC

(57) ABSTRACT

A vibration damper for a semiconductor wafer handling arm includes a spring and a mass coupled to the spring to form a mass spring system that is tuned to vibrate at a structural resonant frequency of the vibrating wafer handling arm. The spring has temperature insensitive spring characteristics and the mass and spring are constructed of materials that do not outgas or produce contaminants in a semiconductor processing environment. The mass spring system is preferably a cantilever beam spring connected to a high response point on the vibrating arm and oriented to vibrate in a plane perpendicular to the plane of the wafer. The mass is preferably slidably adjustable along the length of the cantilever beam spring to adjust the resonant frequency of the vibration damper. Vibration damping of the wafer handling arm is accomplished by the transfer of kinetic energy from the vibrating wafer handling arm to the mass spring system.

11 Claims, 5 Drawing Sheets

METHOD AND APPARATUS FOR DAMPING VIBRATIONS IN A SEMICONDUCTOR WAFER HANDLING ARM

BACKGROUND OF THE INVENTION

1. Field of the Invention

This invention relates to transport mechanisms for rapidly moving and positioning semiconductor wafers. More specifically, this invention relates to methods and devices for damping vibrations in a handling arm used in such a transport mechanism.

2. Description of Related Art

In modern high speed semiconductor manufacturing operations semiconductor wafers are moved into position for processing with an automated transport mechanism. The transport mechanism uses a handling arm to pick up the wafer and move it into the desired position. One end of the handling arm is connected to the driving portion of the transport mechanism and the other end holds the wafer as it is moved.

One limitation on the speed of processing is the speed with which the handling arm can position and remove the wafer from the processing station. The rapid motion necessary to achieve high speed operation excites vibrations in the handling arm. These vibrations must be allowed to dissipate at least partially before the wafer can be picked up or set down. If the vibrations are not allowed to dissipate sufficiently, positioning accuracy deteriorates. In addition, excess vibration results in particle generation due to impacts between the arm and wafer. This introduces contaminants into the processing chamber.

Existing semiconductor wafer handling arms are not provided with vibration dampers due to the difficulty of finding vibration absorbing materials that are suitable for use in semiconductor processing environments. Semiconductor processing environments are typically characterized by wide pressure and temperature ranges and normally have very low contaminant requirements imposed upon them.

Materials commonly used in other applications to absorb vibrations outgas at low pressures. This creates a source of contaminants that is unacceptable in the ultra-clean environment needed for semiconductor wafer processing. In addition, the damping properties of conventional damping materials vary significantly across the temperature range required to process wafers. This makes them a poor choice for use in such an environment.

Bearing in mind the problems and deficiencies of the prior art, it is therefore an object of the present invention to provide a vibration damper for a handling arm that does not use conventional vibration damping materials with their associated contaminant risk and which provides vibration damping for the handling arm over a wide range of processing environment temperatures.

Still other objects and advantages of the invention will in part be obvious and will in part be apparent from the specification.

SUMMARY OF THE INVENTION

The above and other objects, which will be apparent to those skilled in the art, are achieved in the present invention which is directed to a vibration damper for a wafer handling arm that includes a mass and a spring connected between a response point on the wafer handling arm and the mass to form a mass spring system. The mass spring system has a desired vibration frequency set by the characteristics of the spring and the mass and that vibration frequency corresponds to a bending mode vibration frequency of the wafer handling arm to be damped by the vibration damper.

The spring is preferably a cantilever beam spring, although springs of other types may be used. In the preferred design, the mass is slidably mounted on an end of the cantilever beam spring to permit adjustment of the length of the spring and thereby adjust the vibration frequency for the mass spring system.

Adjustment is provided through a slot in the cantilever beam spring. The mass slides along the slot to permit adjustment of the vibration frequency for the damper. In the most highly preferred embodiment, the mass includes a channel sized to match the cantilever beam spring, the mass being guided along the cantilever beam spring by engagement between the channel and the cantilever beam spring.

The wafer held by the wafer handling arm defines a plane and the cantilever beam spring and mass are preferably oriented to vibrate out of the plane defined by the wafer handling arm to damp out of plane vibrations of the wafer handling arm corresponding to the second out of plane bending mode for the arm.

The spring is constructed of a material that has substantially temperature insensitive spring characteristics over a temperature range suitable for semiconductor processing, such as stainless steel. The mass is also preferably constructed of stainless steel. The materials selected for the damper also should not outgas at low pressures found in a semiconductor processing environment.

The present invention also includes the method of damping vibrations in a wafer handling arm. The preferred method includes the steps of:

selecting a spring constructed of a material suitable for use in a semiconductor processing environment;

selecting a mass constructed of a material suitable for use in a semiconductor processing environment;

positioning the mass on the spring to form a mass spring system having a desired vibration frequency, the vibration frequency of the mass spring system corresponding to a bending mode vibration frequency of the wafer handling arm to be damped by the vibration damper; and attaching the mass spring system to the wafer handling arm at a high response point for the bending mode of the wafer handling arm to be damped by the vibration damper.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

In describing the preferred embodiment of the present invention, reference will be made herein to FIGS. 1 to 6 of the drawings in which like numerals refer to like features of the invention.

Figure 1:
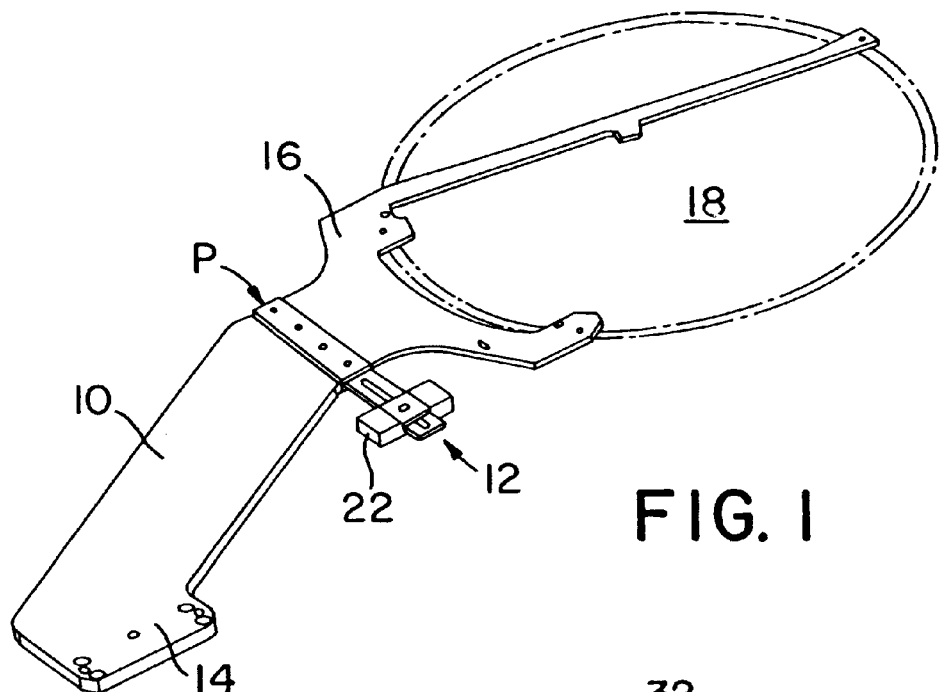
FIG. 1 is a perspective view of a wafer handling arm and a vibration damper according to the present invention. A semiconductor wafer is shown in phantom.

FIG. 1 illustrates a semiconductor wafer handling arm 10 having a vibration damper 12 according to the present invention attached to the arm 10. The base 14 of the handling arm 10 is provided with a mount for attachment to the driving portion of the transport mechanism (not shown) and the opposite end 16 is provided with a mechanism that holds the semiconductor wafer 18 (shown in phantom).

The wafer 18 defines a plane and the vibrations of greatest concern are vibrations due to the second bending mode in the direction perpendicular to that plane. These "Out of plane" vibrations cause impacts between the arm and the wafer that produce contaminant particles. The vibration damper 12 is attached to the arm at point P, which is a high response point for the second bending mode of the wafer handling arm 10. The vibration damper operates by transferring kinetic energy from the vibrating handling arm 10 to a mass spring system comprising the vibration damper 12.

Figure 2:
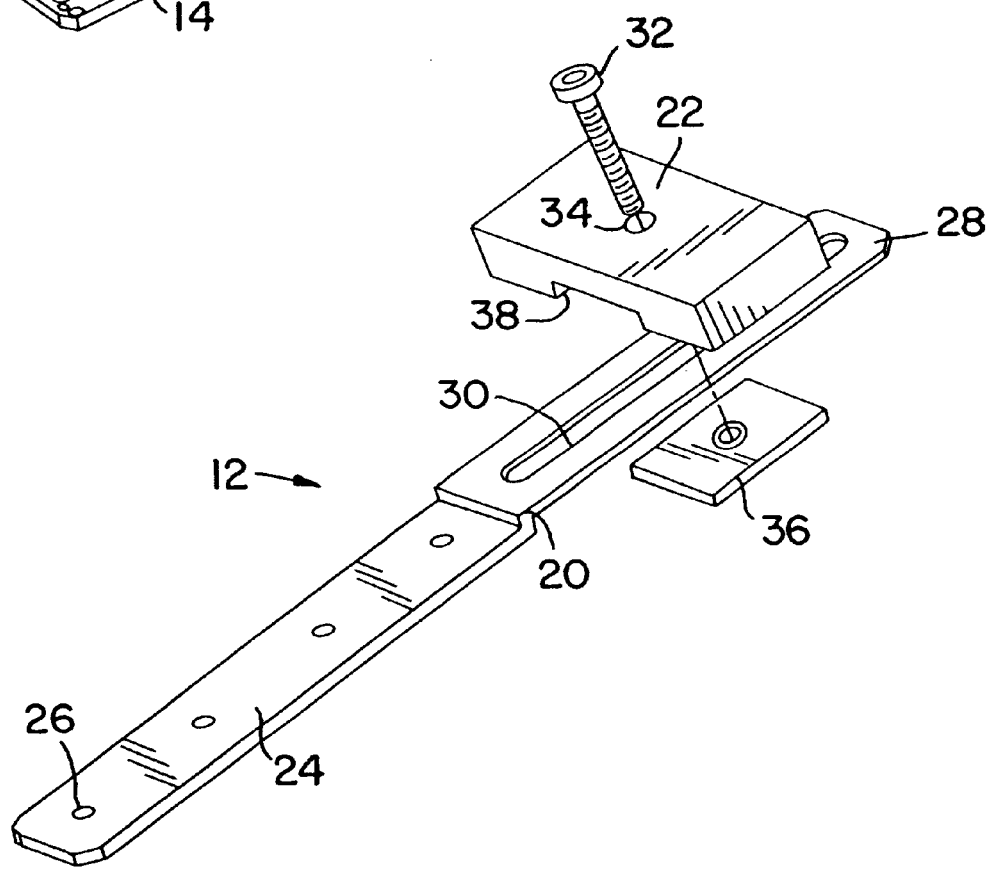
FIG. 2 is an exploded perspective view of a vibration damper according to the present invention.

FIG. 2 provides an exploded detail view of the vibration damper of the present invention. The damper 12 includes a spring 20 with an end mass 22. The spring 20 and mass 22 form a mass spring system that vibrates at a frequency determined by the characteristics of the spring and the mass. The shape of the spring and the material used to make it principally determine the characteristics of the spring. In the embodiment shown, the spring 20 is a cantilever beam type spring, and the spring characteristics are primarily set by the length, width and thickness of the beam. The spring characteristics are adjustable to change the resonant frequency of the mass spring system by providing a sliding adjustable connection between the mass 22 and the beam spring 20. Sliding the mass varies the effective length of the cantilever beam spring.

Although the cantilever-type of spring is preferred, the present invention is not limited to cantilever beam springs. Other types of springs, including coil springs may be used to form the combined mass spring system. The mass spring system simply needs to be capable of being coupled to the arm and have a resonant frequency that allows vibrational kinetic energy (in the bending mode to be damped) to be transferred from the arm to the mass spring system. Those of skill in the art will recognize that many types of mass spring systems can be constructed and oriented in the required way to receive the transferred vibrational kinetic energy. Other bending modes may also be damped by adjusting the resonant frequency and/or orientation of the mass spring system or by using additional vibration dampers.

Also, adjustment of the resonant frequency of the mass spring system is not limited to varying the position of a mass or the length of the spring beam. The frequency may be adjusted by changing the amount of mass attached to the spring or by changing the spring characteristics such as by using a thicker or thinner spring beam, making the beam into a multiple leaf spring and adding or removing spring leaf beams, or by adding coil springs or other types of additional or different shaped springs. It is also contemplated that a non-adjustable mass spring system can be used once the desired spring characteristics and mass are known.

A first end 24 of the cantilever beam spring 20 is provided with mounting holes 26 for attaching the cantilever beam to the handling arm 10 at the desired high vibration response point P corresponding to the bending mode of the arm to be damped. The opposite end 28 of the cantilever spring is provided with slot 30. An attachment screw 32 extends through opening 34 in the end mass 22 and is threaded into nut plate 36.

The end mass 22 is provided with a channel 38 that corresponds to the width of the end 28 of wafer handling arm 20. The channel 38 also receives the nut plate 36. The nut plate and screw 32 also form a part of the mass in the mass spring system. Moving the end mass 22 towards the wafer handling arm 10 increases the resonant frequency of the mass spring system. Moving the end mass 22 away from the handling arm 10 decreases the resonant frequency of the vibration damper. By adjusting the position of the end mass, the resonant frequency of the damper can be tuned to match the dominant structural resonance of the vibrating wafer handling arm.

Preferably the damper is tuned to match the frequency of the handling arm's second out of plane bending mode and the attachment point for the vibration damper to the handling arm is a high response point for this bending mode. The point P is selected to efficiently transfer vibrational kinetic energy from the wafer handling arm to the mass spring system of the vibration damper at the dominant handling arm resonant frequency.

The use of the mass spring system for damping eliminates the necessity for a conventional energy absorbing damping materials with their attendant outgas and temperature dependency problems. The damper may be constructed of any elastic material suitable for use in a wafer processing environment. In the preferred embodiment illustrated, the device is constructed entirely of 304 stainless steel.

Figure 3:
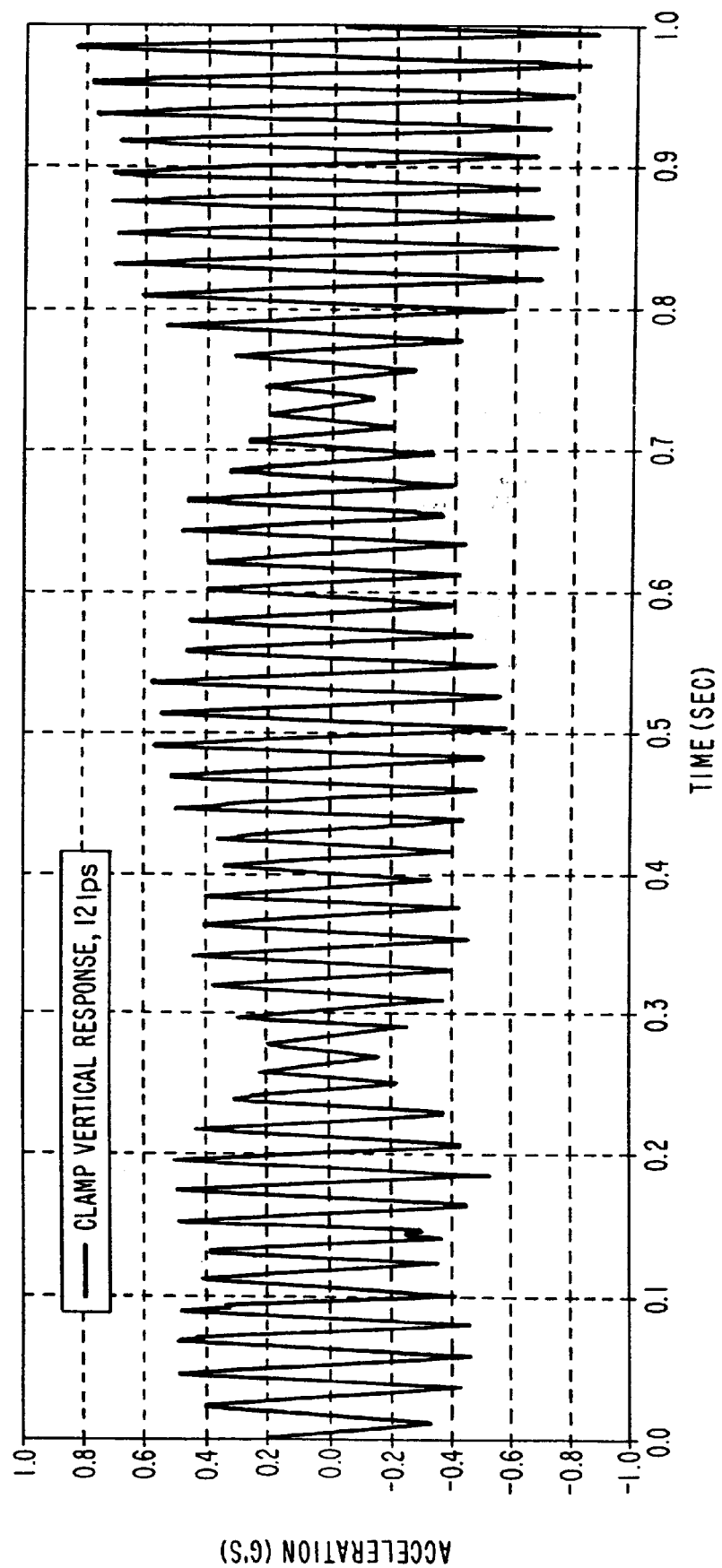
FIG. 3 is a time history graph of the out of plane acceleration of an undamped conventional wafer handling arm moving at a constant arm velocity of twelve inches per second showing out of plane free vibrations.
Figure 4:
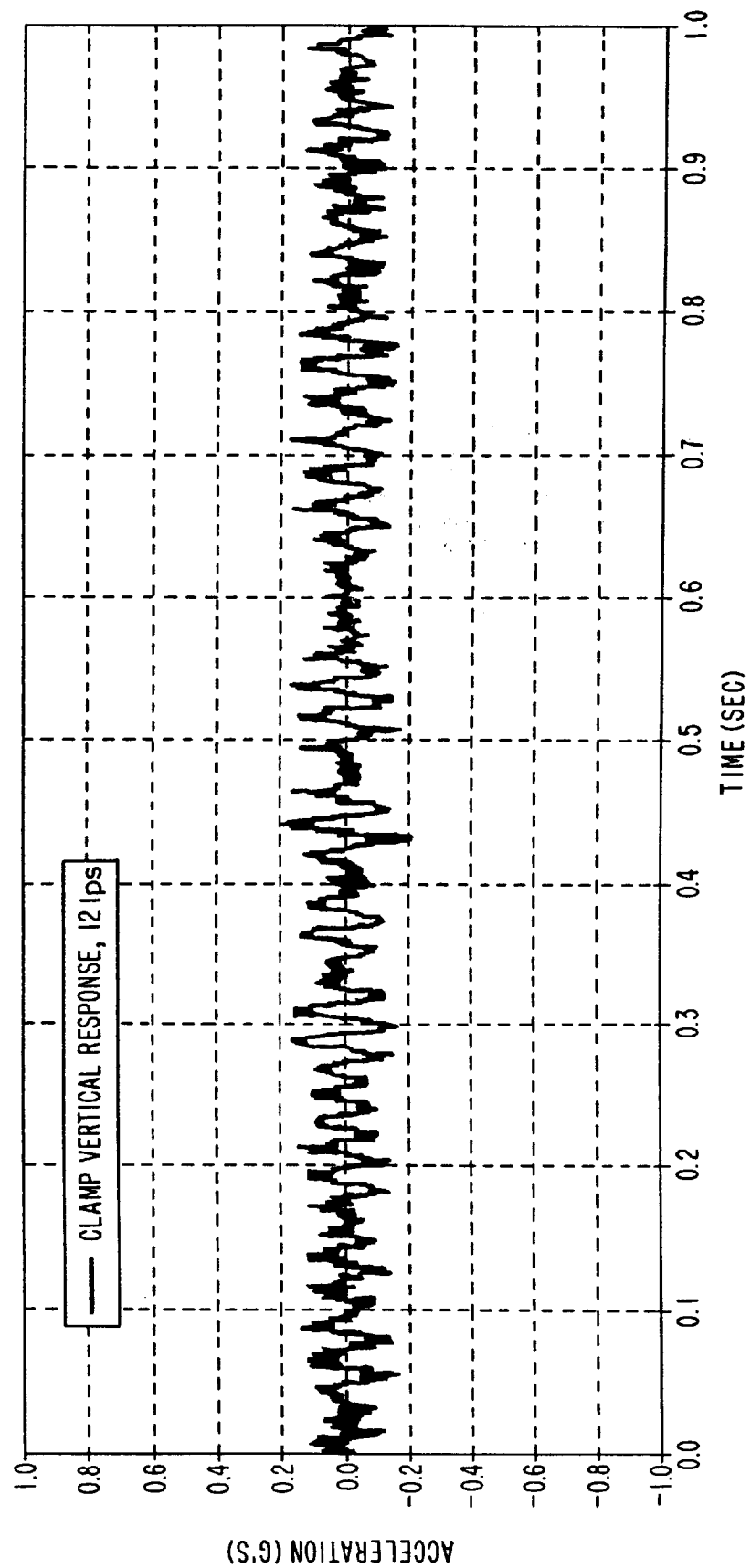
FIG. 4 is a time history graph showing the reduction in out of plane acceleration of the same wafer handling arm measured in FIG. 3, moving at the same speed, when the vibration damper of the present invention is attached as seen in FIG. 1.
Figure 5:
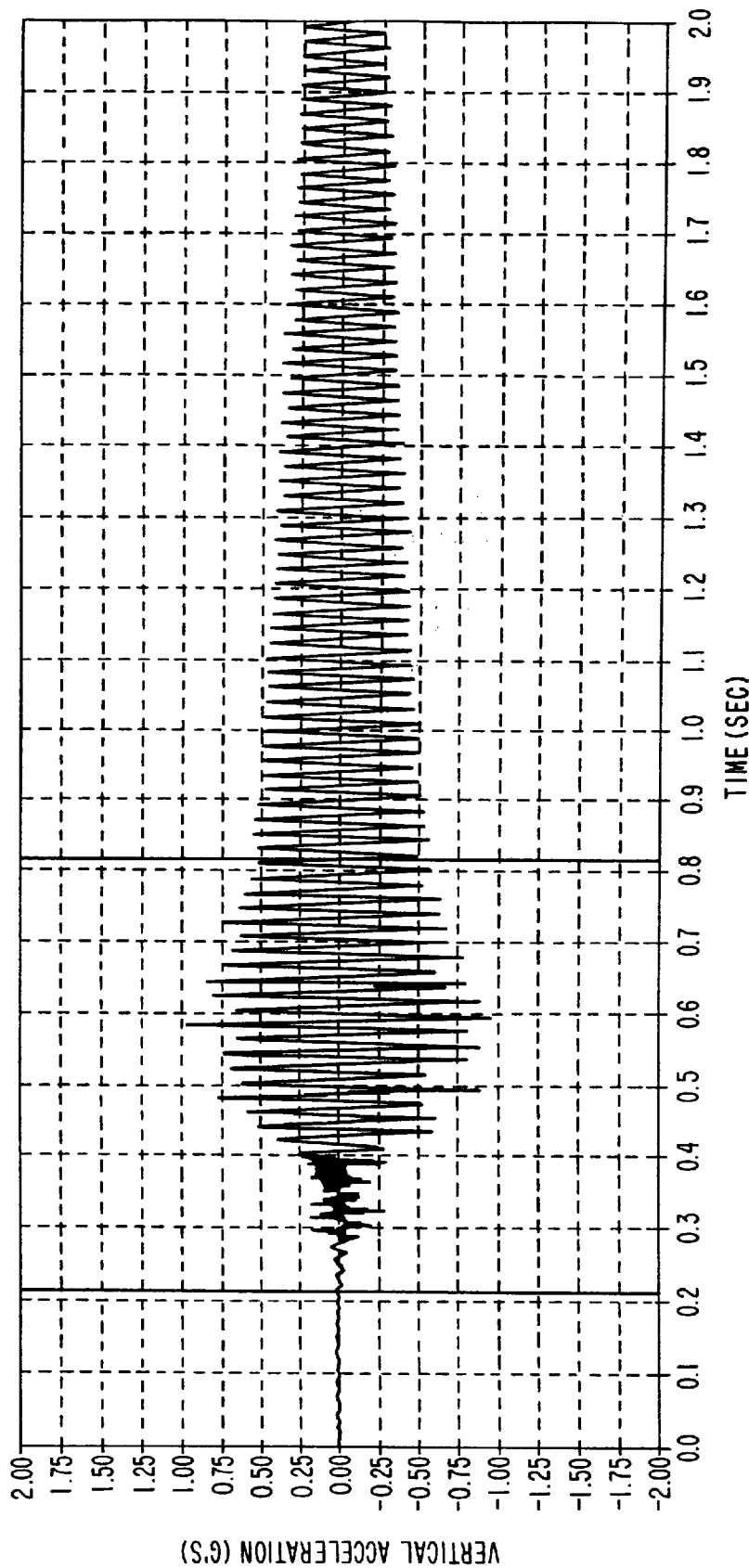
FIG. 5 is a time history graph of the out of plane acceleration of an undamped conventional wafer handling arm following a 0.6 second arm motion showing out of plane free vibrations.
Figure 6:
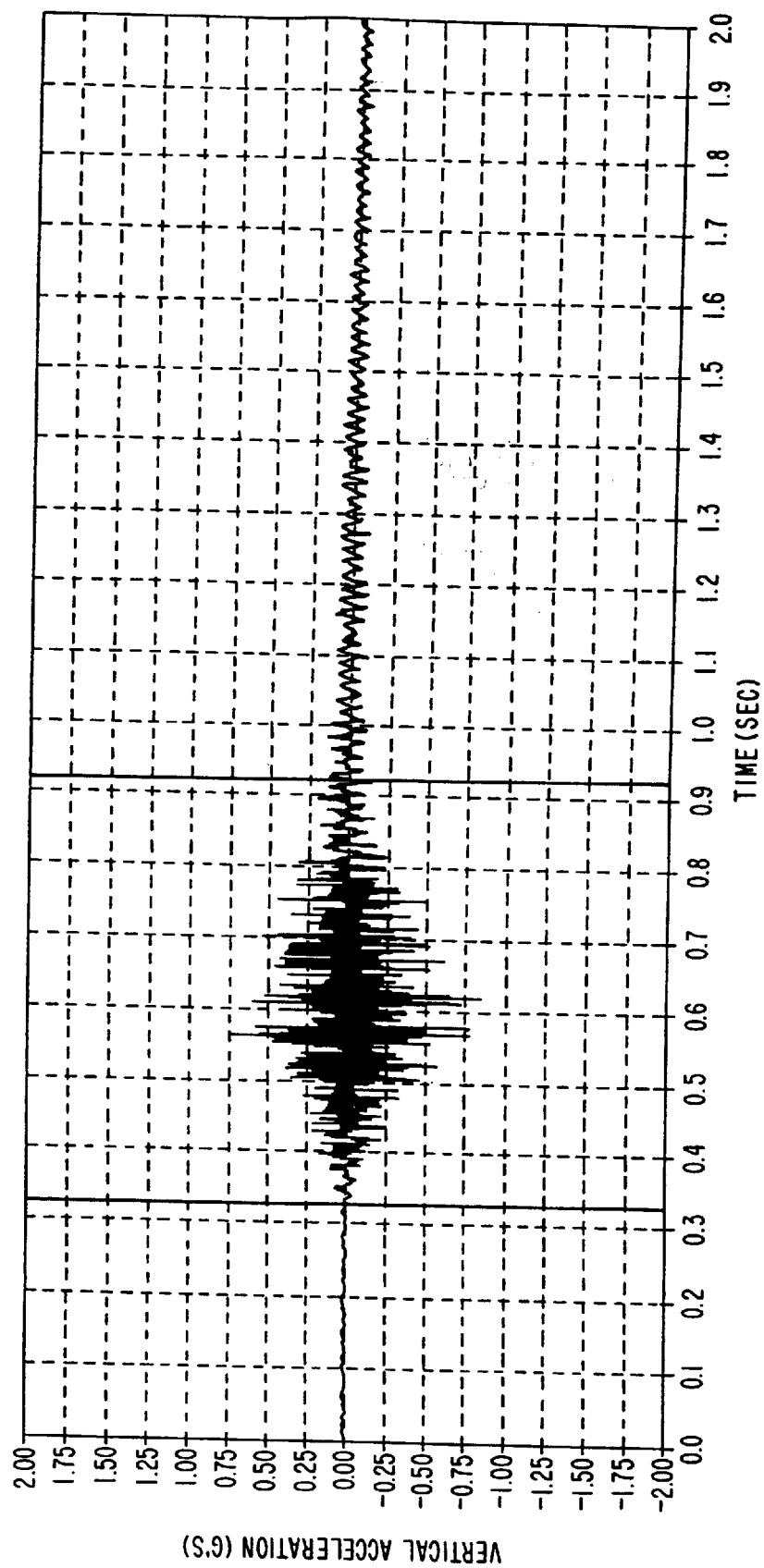
FIG. 6 is a time history graph showing the reduction in out of plane vibration acceleration of the same wafer handling arm measured in FIG. 5, after the same 0.6 second arm motion, when the vibration damper of the present invention is attached as seen in FIG. 1.

FIG. 3 is a graph illustrating the vibrations encountered in a conventional undamped handling arm such as a handling arm shown in FIG. 1 without the vibration damper 12 attached. The measurements shown in FIG. 3 were taken with the arm moving at a constant velocity of 12 inches per second. FIG. 4 illustrates the vibration reduction achieved when the present invention is attached. Vibrational energy has been transferred to the mass spring system reducing the amplitude of the vibrations of the handling arm 10. FIGS. 5 and 6 show the undamped and damped responses, respectively, for a sudden arm motion lasting 0.6 seconds.

As can be seen by comparing FIGS. 4 and 6 to FIGS. 3 and 5, the vibration reduction with the present invention attached is significant and shows a reduction of vibration levels by at least 50%.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A system for reducing vibrations in a wafer handling arm comprising:
   a wafer handling arm for handling wafers, the wafer handling arm defining a plane; and
   a vibration damper connected to a response point on the wafer handling arm, the vibration damper comprising:
      a mass; and
      a spring connected between the response point on the wafer handling arm and the mass to form a mass spring system having a desired vibration frequency in an out of plane direction, the vibration frequency of the mass spring system corresponding to an out of plane bending mode vibration frequency of the wafer handling arm to be damped by the vibration damper to prevent contaminant-producing impacts between the wafer handling arm and the wafer;
      the mass and spring being constructed of contaminant-free materials suitable for a low-contaminant wafer processing environment and the vibration damper providing contaminant-free damping by the transfer of kinetic energy from the wafer handling arm to the mass spring system.

2. The system for reducing vibrations in a wafer handling arm according to claim 1 wherein the spring comprises a cantilever beam spring having a first end connected to the response point on the wafer handling arm and a second end.

3. The system for reducing vibrations in a wafer handling arm according to claim 2 wherein the mass is adjustably mounted to the second end of the cantilever beam spring to permit adjustment of the vibration frequency for the mass and the cantilever beam spring.

4. The system for reducing vibrations in a wafer handling arm according to claim 2 wherein the mass is slidably mounted on the cantilever beam spring to permit adjustment of the vibration frequency for the mass and the cantilever beam spring.

5. The system for reducing vibrations in a wafer handling arm according to claim 2 wherein the second end of the cantilever beam spring includes a slot, the mass being slidably mounted along the slot to permit adjustment of the vibration frequency for the mass and the cantilever beam spring.

6. The system for reducing vibrations in a wafer handling arm according to claim 2 wherein the mass includes a channel sized to match the cantilever beam spring, the mass being guided along the cantilever beam spring by engagement between the channel and the cantilever beam spring.

7. The system for reducing vibrations in a wafer handling arm according to claim 1 wherein the mass is adjustably mounted to the spring to permit adjustment of the vibration frequency for the mass spring system.

8. The system for reducing vibrations in a wafer handling arm according to claim 1 wherein the spring is constructed of a material that has substantially temperature insensitive spring characteristics over a temperature range suitable for semiconductor processing.

9. The system for reducing vibrations in a wafer handling arm according to claim 8 wherein the spring is constructed of stainless steel.

10. The system for reducing vibrations in a wafer handling arm according to claim 1 wherein the spring is constructed of a material that does not outgas in a semiconductor processing environment.

11. The system for reducing vibrations in a wafer handling arm according to claim 1 wherein the vibration frequency of the mass spring system corresponds to a second out of plane bending mode vibration frequency of the wafer handling arm.

* * * * *